United States Patent [19]
Minasi et al.

[11] Patent Number: 5,854,578
[45] Date of Patent: Dec. 29, 1998

[54] ACTIVE CIRCUIT HAVING A TEMPERATURE STABLE BIAS

[75] Inventors: David H. Minasi, Plantation; Peter J. Yeh, Coral Springs; Roger A. Davenport, Ft. Lauderdale; Gustavo V. Leizerovich, Miami Lakes, all of Fla.

[73] Assignee: Motorola, Inc., Schaumburg, Ill.

[21] Appl. No.: 929,480

[22] Filed: Sep. 15, 1997

[51] Int. Cl.⁶ .............................. H03B 5/12; H03F 1/30; H03L 1/02

[52] U.S. Cl. ............. 331/117 R; 330/285; 330/289; 330/290; 331/176; 331/177 V

[58] Field of Search ............... 331/176, 117 R, 331/177 V; 330/285, 289, 290

[56] References Cited

U.S. PATENT DOCUMENTS

| | | | |
|---|---|---|---|
| 4,122,403 | 10/1978 | Cave | 330/289 |
| 5,341,112 | 8/1994 | Haman | 331/176 |
| 5,418,497 | 5/1995 | Martin | 331/48 |
| 5,532,648 | 7/1996 | Culling | 330/289 |

*Primary Examiner*—Siegfried H. Grimm
*Attorney, Agent, or Firm*—Scott M. Garrett

[57] ABSTRACT

An active circuit includes an amplifying transistor (102), a voltage reference (208), and an active bias circuit. The active bias circuit controls the operating point of the amplifying transistor, and includes a bias transistor (224) which is controlled by the voltage reference and the collector current of the amplifying transistor. As the temperature of the amplifying transistor changes, the tendency of the collector current to change is counter-acted by the bias transistor and the voltage reference.

19 Claims, 4 Drawing Sheets

ACTIVE CIRCUIT HAVING A TEMPERATURE STABLE BIAS

TECHNICAL FIELD

This invention relates in general to active amplifier circuits, and more particularly to active amplifier circuits having temperature compensating active bias.

BACKGROUND

Active amplifier circuits are in widespread use in modern electronic and electrical equipment, particularly in the instrumentation and communications fields. Such circuits comprise an amplifying transistor or transistors operated in the active, or linear, region of bias. Examples of such circuits include signal power amplifiers and oscillators. An oscillator is simply an amplifying circuit having at least a gain factor of 1 and an appropriate feedback network. The value of such circuits is clear as nearly all modern communications and instrumentation equipment utilize them.

In order to operate a transistor in its active region, it must be provided with an appropriate bias condition. That is, the direct current (DC) conditions under which it operates cause it to act as an amplifier, and at the same time, avoid operation in either the saturation or the cut-off regions. This is typically done by setting the current through the transistor to a stable operating point outside of the cut-off and saturation regions, and such that the signal swing at the output for the expected input signal will not cause the transistor or transistors to leave the active region.

To illustrate a typical biasing configuration, FIG. 1 shows a conventionally biased voltage controlled oscillator circuit 100. The circuit biases a transistor 102 into the active region of operation, and provides a feedback network 104, to cause oscillation of the voltage at the collector 105, and provide a signal through an output network 107. The biasing is accomplished by use of a bias network 106, and an emitter resistor 108. A blocking choke 109 is used to present a very low impedance to DC current, but a very high impedance to high frequency signals. A control network 110 is used to change the oscillation frequency by varying a control voltage 112. A blocking capacitor 113, in combination with a high pass element 115, prevents any DC level from the control network affecting the bias of the amplifying transistor.

The arrangement of the transistor 102, biasing network 106 and emitter resistor 108 is very common. Further, it is well known that silicon transistors are affected by changes in temperature, and to provide thermal stability in the type of biasing circuit shown in FIG. 1, it is standard practice to select the emitter resistor 108 such that the voltage drop across it will be in the range of 2–3 times the magnitude of the base-emitter junction voltage 114. To accommodate this voltage drop, the supply voltage is selected high enough so that sufficient voltage is available between an upper voltage potential 116 and a lower voltage potential 118 to accommodate the expected signal swing at the collector 105, and the necessary voltage across the emitter resistor.

However, there are two factors arising in modern electronics that work against this standard approach. The first factor that makes the standard biasing arrangement problematic is that, in portable hand held electronic devices, such as portable two way radio communication devices, there is a move towards low voltage operation for several reasons. For example, digital circuits require less power at lower operating voltages, and are increasingly prevalent in radio designs. In some current radio designs the digital circuitry comprises a majority of the radio circuitry. Another reason for the trend toward lower voltage is to reduce the size, complexity, and cost of associated battery devices. Analog circuits in radios using low voltage supplies, such as power amplifiers and oscillators, could be provided with higher supply voltages by regulating the battery voltage to a higher level, but this necessarily requires adding a complex and costly boost type switching regulator. Such regulators would also introduce a significant amount of electrical noise into the system. Therefore, it is more desirable to find ways of getting the necessary performance from the analog circuits at the lower voltages besides regulating the supply voltage.

A second factor that precludes the use of the standard biasing arrangement is the emphasis on low noise circuits. The thermal noise introduced by the emitter resistance is considerable, and will contribute to the phase noise of an oscillator circuit. The current emphasis of low noise amplifiers, that is, those without emitter resistors, therefore is faced with the temperature stability issue mentioned above.

Therefore, there is a need for an active circuit with a stable bias over temperature, that also minimizes the effect of additive noise of emitter resistance, and also will allow low voltage operation. This need is felt particularly in hand held, portable electronic devices, and more particularly in communications and instrumentation equipment where noise limits the performance of such equipment. The present invention addresses these needs, while avoiding problems found in previous designs.

DETAILED DESCRIPTION OF THE PREFERRED EMBODIMENT

Figure 1:
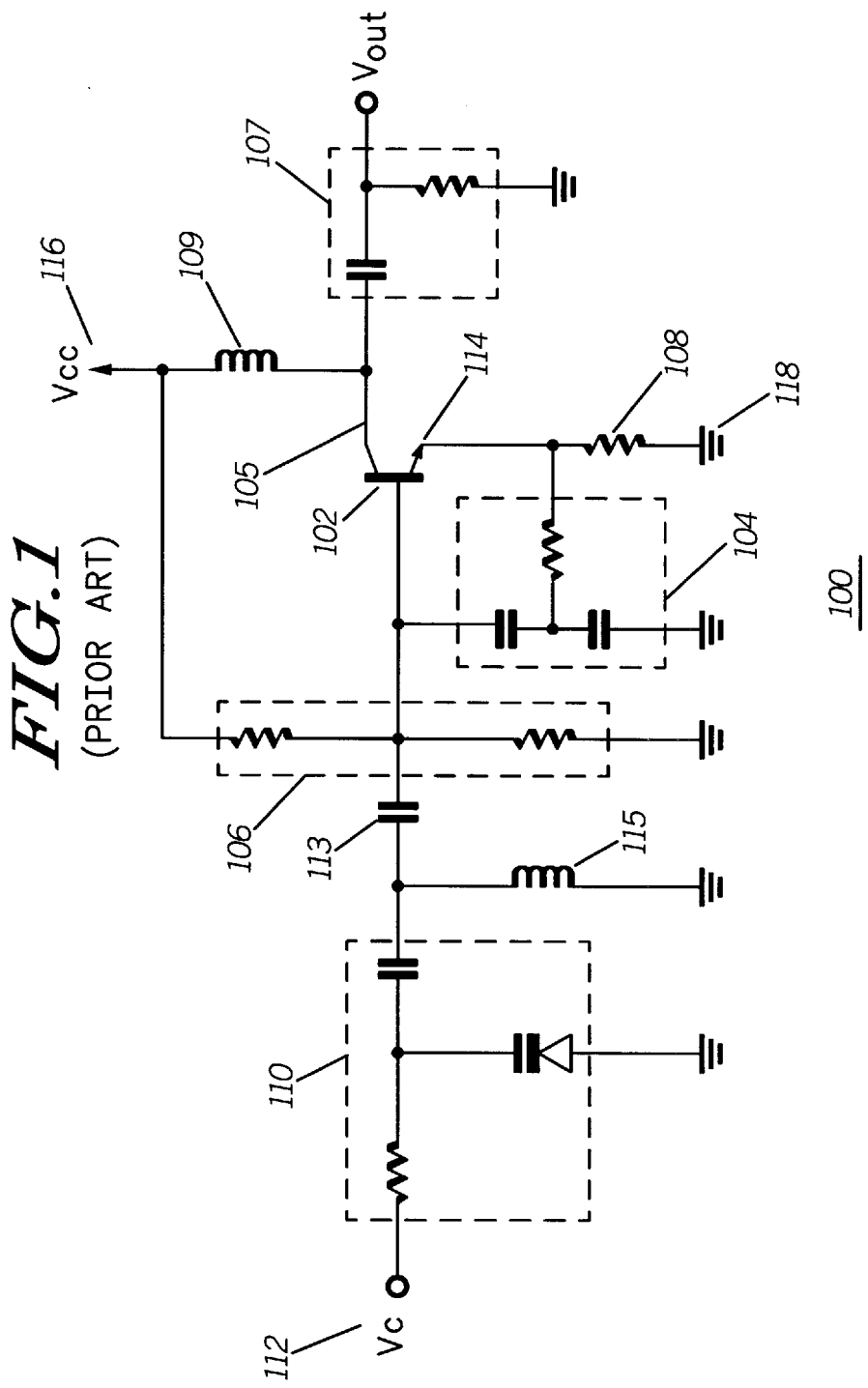
FIG. 1 shows a schematic circuit diagram of a conventionally biased voltage controlled oscillator.

While the specification concludes with claims defining the features of the invention that are regarded as novel, it is believed that the invention will be better understood from a consideration of the following description in conjunction with the drawing figures, in which like reference numerals are carried forward.

To solve the problem of bias drift over an operational temperature range, the present invention employs an auto-correcting bias circuit comprised of a voltage reference having a temperature coefficient, and a bias transistor, responsive to the voltage reference, connected to the amplifying transistor and having a temperature coefficient substantially equal to the temperature coefficient of the voltage reference. The collector current of the amplifying transistor is sampled, and used to adjust the bias current supplied to the amplifying transistor to maintain a substantially constant collector current level over a predetermined temperature range.

Figure 2:
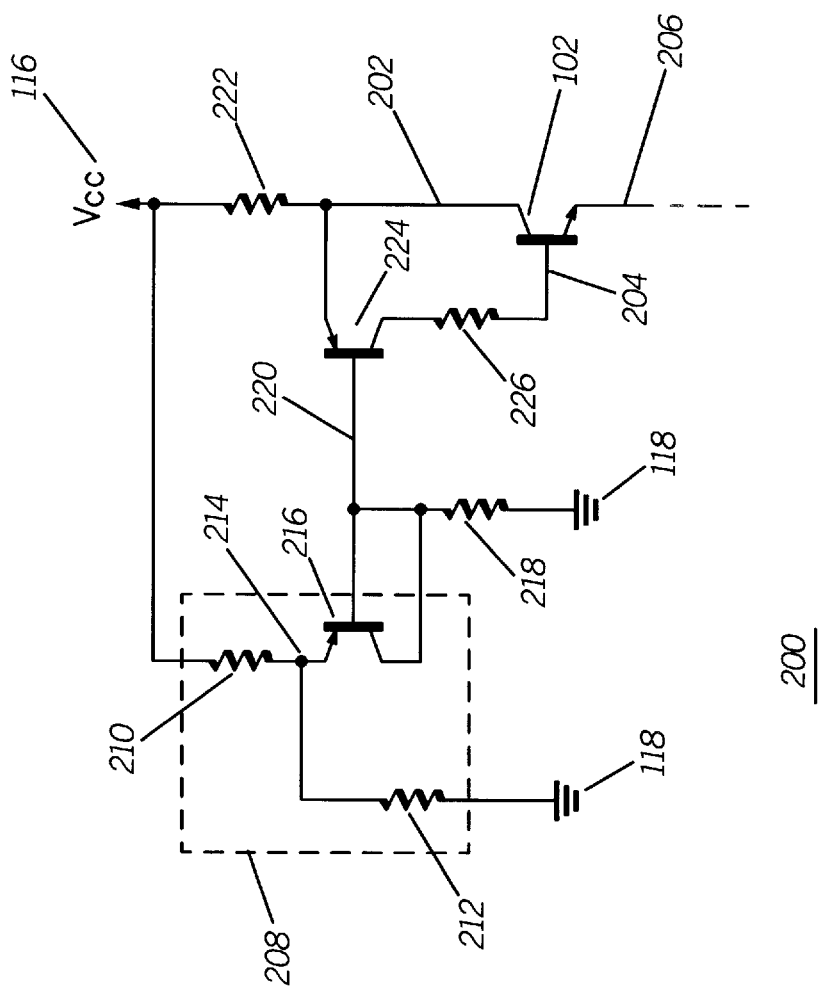
FIG. 2 shows a schematic diagram of an active circuit in accordance with the invention.

Referring now to FIG. 2, which shows a schematic diagram of an active circuit 200 in accordance with the invention, the elements of an amplifying transistor 102, an upper voltage potential 116 and a lower voltage potential 118 are present as in the conventional circuit of FIG. 1. The circuit illustrated here represents the circuitry involved in biasing the amplifying transistor 102, and establishing DC conditions. Generally, the amplifying transistor 102 has a collector 202, base 204, and an emitter 206. Depending on the particular application of the illustrated circuit, the emitter may be connected to the lower voltage potential either directly, or through some circuit network.

To establish the proper DC operating point of the amplifying transistor, a voltage reference 208 is used. In the preferred embodiment, the voltage reference comprises a means for establishing a stable voltage level at a reference node 214, such as a voltage divider formed by resistors 210 and 212 connected between the upper voltage potential and the lower voltage potential. It is contemplated that other means of providing a stable voltage level at the reference node may be used, such as a separate regulated supply, but if the voltage differential between 116 and 118 is stable, then a voltage divider is an inexpensive solution. A reference transistor 216 is diode connected between the reference node 214 and the lower voltage potential by a pull down resistor 218. By diode connected it is meant that the base and collector terminals are connected together, effectively turning the transistor into a diode. The output of the circuit structure within block 208 is a reference voltage level on line 220. Because the voltage reference 208 uses a diode connected transistor, the reference voltage level has a temperature coefficient due to the temperature characteristics of the silicon transistor. Generally, the voltage between the reference node 214 and the reference voltage on line 220 changes by about −2 mV per degree centigrade increase, as is well known in the art for silicon based transistors.

The amplifying transistor 102, also a silicon transistor, is affected by the same coefficient of operation with respect to temperature. In order to avoid the problems associated with the conventional biasing arrangement, the present invention's bias circuit is comprised of a current sense resistor 222, bias transistor 224, and a bias resistor 226. The current sense resistor is connected between the upper voltage potential and the collector of the amplifying transistor. Accordingly, a voltage drop is produced across it proportional to the collector current of the amplifying transistor. The bias transistor is connected between the collector and the base of the amplifying transistor, preferably through a bias resistor 226. In the preferred embodiment, the bias transistor is a PNP type having an emitter connected to the collector of the amplifying transistor, a base connected to the pull down resistor 218 and the reference transistor 216, and a collector connected to the base of the amplifying transistor through the bias resistor 226. In the preferred embodiment the reference transistor is also a PNP type bipolar transistor, and the bias transistor and the reference transistor are matched. In practice these two components would typically be realized on a common integrated circuit.

In practicing the invention, the optimum collector current is dictated by the particular application and related considerations. The current sense resistor is chosen such that the voltage drop across it, as a result of the collector current, is not a significant detraction from the supply voltage. For example, if the voltage differential between the upper voltage potential and lower voltage potential were 2 volts, a drop of 0.1 volts across the current sense resistor, a loss of only 5%, is unlikely to significantly affect the performance of the amplifying transistor. Continuing with this example, assume that the optimum collector current for the particular application is 6 milliamps (mA). The current sense resistor is selected so that at 6 mA of collector current, a voltage drop of 0.1 volts appears across the current sense resistor, which therefore would have a value of about 16.67 ohms.

To set the collector current at the desired level, the voltage divider formed by resistors 210 and 212 is selected such that the voltage at the reference node 214 is substantially equal to that which will be found at the collector of the amplifying transistor when the collector is at the desired level. In other words, the supply voltage at 116 minus the voltage drop across the current sense resistor 222 when the collector current is at the desired level. Since, by connecting the base of the bias transistor to the base of the reference transistor, and by selecting the transistors such that they are matched, the collector currents of the reference transistor 216 and the bias transistor 224 can be set to approximately the same level. However, it should be noted that it is possible for the collector currents of these transistor to vary substantially without significantly affecting the performance of the circuit. This is due to the non-linearity of the emitter-base junction voltage with respect to emitter-base junction current. Accordingly, the emitter-base junction voltage of the reference transistor and the bias transistor will be very similar. The resulting collector current of the bias transistor is a bias current for the amplifying transistor. Since the variation of the emitter-base junction voltage is affected much more by variation in temperature then by its collector current, as the temperature of the system changes, the bias current delivered to the amplifying transistor is dictated by the temperature of the system.

To illustrate how the invention maintains the collector current of the amplifying transistor over a predetermined temperature range, consider the following example. If the temperature of the amplifying transistor changes such that it tends to draw more collector current, the voltage drop across the current sense resistor would tend to increase proportionately. As the base voltage of the reference transistor is substantially fixed at the reference voltage level on line 220, the emitter-base junction voltage of the bias transistor must decrease. However, decreasing the emitter-base voltage of the bias transistor causes less bias current to flow into the amplifying transistor, thereby reducing the collector current of the amplifying transistor. Likewise, any tendency to reduce the collector current of the amplifying transistor as a result of thermal effects will increase the bias voltage on the bias transistor, causing more bias current to flow into the amplifying transistor, and thereby counter acting any tendency to reduce the collector current of the amplifying transistor. This automatic bias correction allows stable operating condition over temperature.

Figure 3:
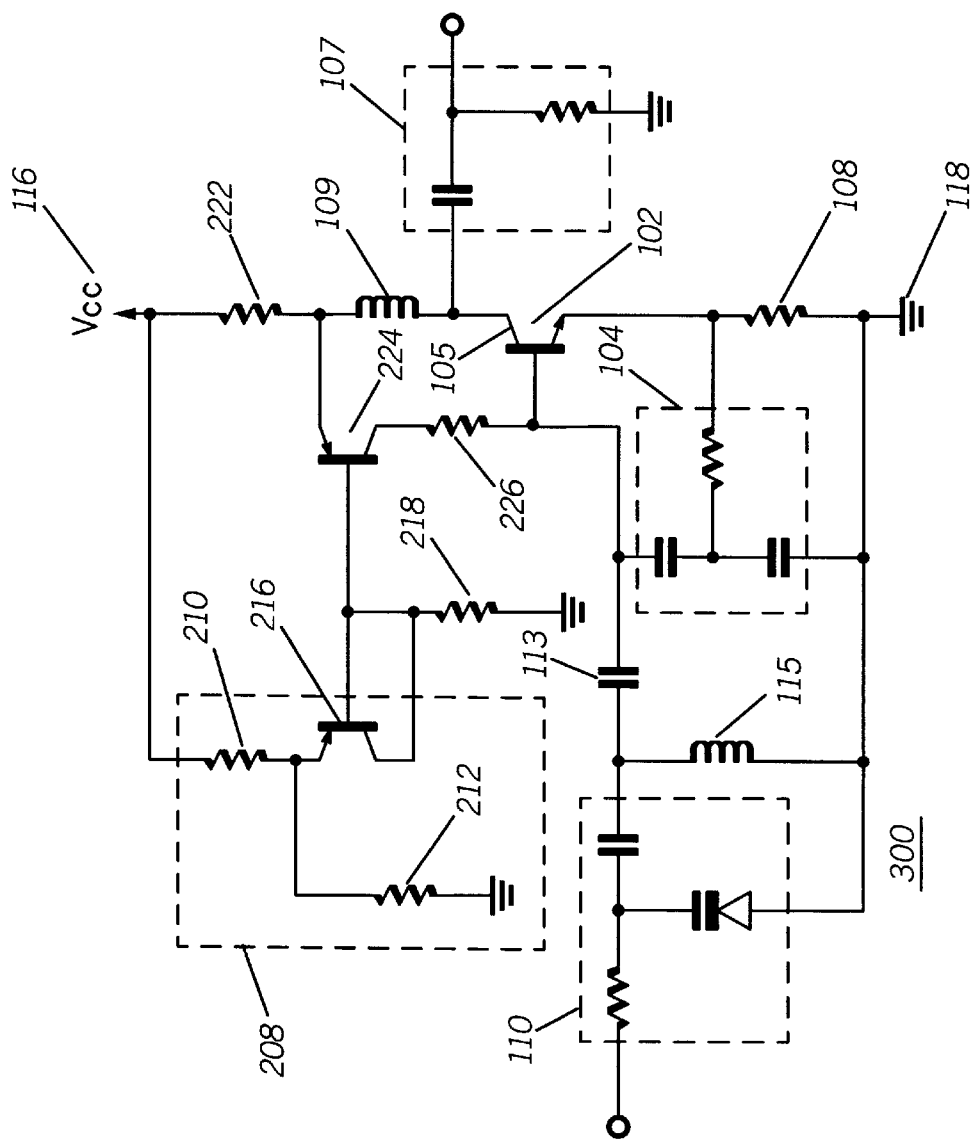
FIG. 3 shows a schematic diagram of an oscillator circuit in accordance with a first embodiment of the invention.

Referring now to FIG. 3, where there is shown a schematic diagram of an oscillator circuit 300 in accordance with a first embodiment of the invention. The oscillator circuit is a colpitts oscillator having a voltage control network 110, thus making it a voltage controlled oscillator (VCO). As shown in FIG. 1, the oscillator comprises the elements of an amplifying transistor 102, an output network 107 for passing a signal from the collector 105, a feedback network 104, and a control network 110. However, instead of the conventional bias network 106 of FIG. 1, the VCO shown here utilizes the active voltage reference and the bias transistor shown and described in reference to FIG. 2. A benefit of such a VCO is that, since bias drift over temperature is eliminated, the phase noise performance of the oscillator circuit over temperature is reduced.

Figure 4:
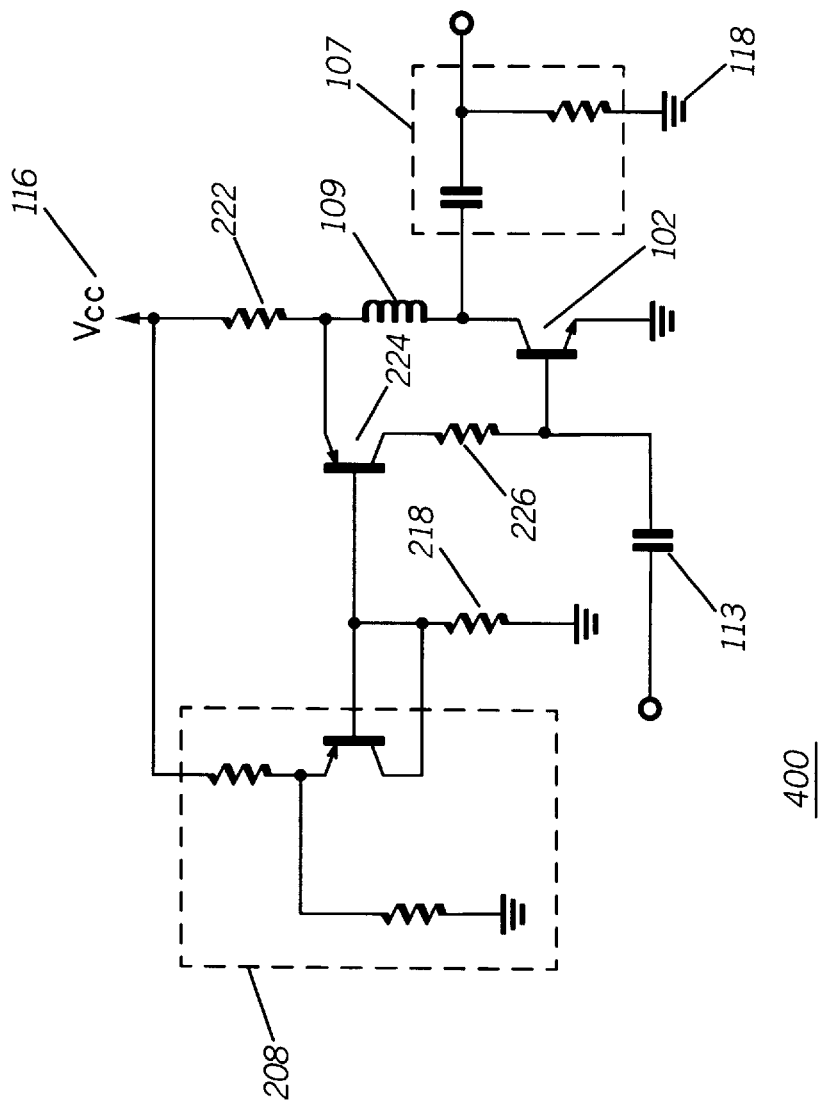
FIG. 4 shows a schematic diagram of an amplifier circuit in accordance with a second embodiment of the invention.

Another type of active circuit that can benefit from the present invention is a low noise amplifier, as shown in FIG. 4. A low noise amplifier 400 omits the emitter resistor (108) to reduce the amount of thermal noise present in the output signal. It also lends itself to low voltage applications since the voltage drop over the emitter resistor is not required of the supply 116. Typically low noise amplifier circuits require complex active bias circuits to combat bias drift over temperature, however, by use of the present invention, only two small signal transistors are necessary to achieve complete temperature stability of the amplifying transistor's operating point.

The present invention therefore improves the performance of active circuits by stabilizing bias conditions with respect to temperature. An auto-correction of bias is achieved with a minimal use of circuitry, which enhances noise performance in general. In particular the present invention is useful in oscillator circuits and low noise amplifier circuits.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. In particular it is contemplated that the polarities of the upper and lower voltage potentials could be reversed, and the polarities of the various transistors likewise reversed, so that PNP transistors become NPN transistors. Such a reversal would produce a circuit nearly identical in structure and operation to that disclosed hereinabove.

What is claimed is:

1. An active circuit having a temperature stable bias, comprising:
    an amplifying transistor having a collector, an emitter, a base, and a collector current;
    a voltage reference having a temperature coefficient; and
    a bias transistor connected between the collector and the base of the amplifying transistor, and responsive to the voltage reference, the bias transistor having a temperature coefficient substantially equal to the temperature coefficient of the voltage reference, the bias transistor providing a bias current to the amplifying transistor such that the collector current is held substantially constant over a predetermined temperature range.

2. An active circuit as defined in claim 1, wherein the active circuit is an oscillator circuit.

3. An active circuit as defined in claim 2, wherein the oscillator circuit is a voltage controlled oscillator circuit.

4. An active circuit as defined in claim 2, wherein the oscillator circuit is a colpitts oscillator circuit.

5. An active circuit as defined in claim 1, wherein the active circuit is a low noise amplifier circuit.

6. An active circuit as defined in claim 1, wherein the voltage reference comprises a PNP transistor connected in a diode configuration.

7. An active circuit as defined in claim 1, wherein the bias transistor is a PNP transistor.

8. An active circuit connected between an upper voltage potential and a lower voltage potential, and having a temperature stable bias, the active circuit comprising:
    an amplifying transistor having a collector, an emitter, a base, and a collector current;
    a reference node for providing a stable voltage level;
    a reference transistor connected in a diode configuration between the reference node and a pull down resistor, the reference transistor providing a reference voltage;
    a bias transistor connected between the collector and the base of the amplifying transistor, and responsive to the reference voltage such that the collector current of the amplifying transistor is held substantially constant over a predetermined temperature range; and
    a current sense resistor connected between the collector of the amplifying transistor and the upper voltage potential.

9. An active circuit as defined in claim 8, wherein the amplifying transistor forms an oscillator circuit.

10. An active circuit as defined in claim 9, wherein the oscillator circuit is a voltage controlled oscillator circuit.

11. An active circuit as defined in claim 8, wherein the amplifying transistor forms a low noise amplifier circuit.

12. An active circuit as defined in claim 8, wherein the reference node is formed from a voltage divider connected between an upper voltage potential and a lower voltage potential.

13. An active circuit connected between an upper voltage potential and a lower voltage potential, comprising:
    an amplifying transistor having a collector, an emitter, a base, and a collector current, a current sense resistor connected between the upper voltage potential and the collector;
    a voltage divider connected between the upper voltage potential and the lower voltage potential, and providing a reference node;
    a reference transistor connected in a diode configuration between the reference node and a pull down resistor, the reference transistor providing a reference voltage across the pull down resistor; and
    a bias transistor having a first terminal connected to the collector of the amplifying transistor, a second terminal connected to the pull down resistor and the reference transistor, and a third terminal connected to the base of the amplifying transistor through a bias resistor.

14. An active circuit as defined by claim 13, wherein the amplifying transistor forms an oscillator circuit.

15. An active circuit as defined in claim 14, wherein the oscillator circuit is a voltage controlled oscillator circuit.

16. An active circuit as defined in claim 13, wherein the amplifying transistor forms a low noise amplifier circuit.

17. An active circuit as defined in claim 13, wherein the bias transistor and the reference transistor are PNP transistors.

18. An active circuit as defined in claim 13, wherein the reference transistor and the bias transistor each have a gain factor which is substantially equal to each other.

19. An active circuit as defined in claim 13, wherein the bias transistor is responsive to the reference voltage and the collector current such that a bias current provided the base of the amplifying transistor changes over a predetermined temperature range such that the collector current is held substantially constant over the predetermined temperature range.

* * * * *